(12) United States Patent
Chan et al.

(10) Patent No.: US 7,880,551 B2
(45) Date of Patent: Feb. 1, 2011

(54) SYSTEMS AND METHODS FOR DISTRIBUTING A CLOCK SIGNAL

(75) Inventors: Steven Chan, Yonkers, NY (US); Kenneth L. Shepard, Ossining, NY (US); Zheng Xu, Staten Island, NY (US)

(73) Assignee: The Trustees of Columbia University in the City of New York, New York, NY (US)

(*) Notice: Subject to any disclaimer, the term of this patent is extended or adjusted under 35 U.S.C. 154(b) by 0 days.

(21) Appl. No.: 12/159,750

(22) PCT Filed: Dec. 29, 2006

(86) PCT No.: PCT/US2006/049574

§ 371 (c)(1),
(2), (4) Date: Jun. 10, 2009

(87) PCT Pub. No.: WO2008/005048

PCT Pub. Date: Jan. 10, 2008

(65) Prior Publication Data

US 2009/0302952 A1    Dec. 10, 2009

Related U.S. Application Data

(60) Provisional application No. 60/754,728, filed on Dec. 29, 2005.

(51) Int. Cl.
| | |
|---|---|
| G06F 1/00 | (2006.01) |
| H03B 5/00 | (2006.01) |
| H03B 5/18 | (2006.01) |
| H03L 5/00 | (2006.01) |
| H03L 7/00 | (2006.01) |
| H03L 7/099 | (2006.01) |
| H03L 7/24 | (2006.01) |

(52) U.S. Cl. .................. 331/55; 331/2; 331/96; 331/117 D; 331/179; 331/183; 713/500; 713/503

(58) Field of Classification Search .......... 331/2, 331/36 C, 48, 55, 56, 96, 107 DP, 117 R, 331/117 FE, 117 D, 132, 177 V, 179, 182, 331/183, 185, 186; 713/500, 503; 716/12–16
See application file for complete search history.

(56) References Cited

U.S. PATENT DOCUMENTS 5,561,399 A    10/1996  Haartsen et al.

(Continued)

OTHER PUBLICATIONS

AH Muhtaroglu, Greg Taylor, and Tawfik Rahal-Arabi. On-die droop detector for analog sensing of power supply noise. *IEEE Journal of Solid-State Circuits*, 39(4):651-660, Apr. 2004.

(Continued)

*Primary Examiner*—David Mis
(74) *Attorney, Agent, or Firm*—Wilmer Cutler Pickering Hale and Dorr LLP

(57) ABSTRACT

Systems and methods for distributing a clock signal are disclosed. In some embodiments, systems for distributing a clock signal include a plurality of resonant oscillators, each comprising an inductor; and a differential clock grid that distributes the clock signal. The differential clock grid is coupled to the plurality of resonant oscillators and the clock signal, and the inductances of the inductors are configured such that a resonant frequency of the plurality of resonant oscillators is substantially equal to the frequency of the clock signal.

22 Claims, 7 Drawing Sheets

U.S. PATENT DOCUMENTS

| | | | |
|---|---|---|---|
| 6,249,192 B1* | 6/2001 | Gabara et al. | 331/117 R |
| 2005/0057286 A1 | 3/2005 | Shepard et al. | |
| 2005/0114820 A1* | 5/2005 | Restle | 716/13 |

OTHER PUBLICATIONS

Alan J. Drake, Kevin J. Nowka, Tuyet Y. Nguyen, Jeffrey L. Burns, and Richard B. Brown. Resonant clocking using distributed parasitic capacitance. *IEEE Journal of Solid-State Circuits*, 39(9):1520-1528, Sep. 2004.

Ali Hajimiri, Sotirios Limotyrakis, and Thomas H. Lee. Jitter and phase noise in ring oscillators. *IEEE Journal of Solid-State Circuits*, 34{6}:790-804, Jun. 1999.

Ansoft Corporation. HFSS: High Frequency Structure Simulator 3D field solver, printed from http://www.ansoft.com/products/hf/hfss/ on Aug. 13, 2010.

Ansoft Corporation. Maxwell 2D field solver, printed from http://www.ansoft.com/products/em/max2d/ on Aug. 13, 2010.

C. Patrick Yue and S. Simon Wong. On-chip spiral inductors with patterned ground shields for Si-based RF IC's. *IEEE Journal of Solid-State Circuits*, 33(5):743-752, May 1998.

D. Pham et al. The design and implementation of a first-generation CELL processor. In *Digest of Technical Papers, International Solid-State Circuits Conference*, pp. 184-185, 2005.

Dan Weinlader, Ron Ho, Chih-Kong Ken Yang, and Mark Horowitz. An eight channel 36GSample/s CMOS timing analyzer. In *Digest of Technical Papers, International Solid-State Circuits Conference*, pp. 170-171, 2000.

Ferd E. Anderson, J. Steve Wells, and Eugene Z. Berta. The core clock system on the next generation Itanium microprocessor. In *Digest of Technical Papers, International Solid-State Circuits Conference*, pp. 146-147, 2002.

Frank O'Mahony, C. Patrick Yue, Mark A. Horowitz, and S. Simon Wong. A 10-GHz global clock distribution using coupled standing-wave oscillators. *IEEE Journal of Solid-State Circuits*, 38(11):1813-1820, Nov. 2003.

H. Mizuno and K. Ishibashi. A noise-immune GHz-clock distribution scheme using synchronous distributed oscillators. In *Digest of Technical Papers, International Solid-State Circuits Conference*, pp. 404-405, 1998.

Hideki Hasegawa, Mieko Furukawa, and Hisayoshi Yanai. Properties of microstrip line on Si—SiOi system. *IEEE Transactions on Microwave Theory and Techniques*, MTT-19(II):869-881, Nov. 1971.

Hiok-Taiq Ng et al. A second-order semidigital clock recovery circuit based on injection locking. *IEEE Journal of Solid-Stale Circuits*, 38(12):2101-2110, Dec. 2003.

IBM Research "Resonant Clock Networks, Innovation Matters" printed from http://domino.research.ibm.com/comm/research.nsf/pages/r.vlsi.innovation.html on Nov. 14, 2005.

J.G. Maneatis. Low-jitter process-independent DLL and PLL based on self-bias techniques. *IEEE Journal of Solid-StateCircuits*, 31(1I):1723-1732, Nov. 1996.

James Montanaro et al. A 160-MHz, 32-b, 0.5-W CMOS RISC microprocessor. *IEEE Journal of Solid-State Circuits*,31(II):1703-1714, Nov. 1996.

Jason Hart et al. Implementation of a 4th-generation I.SGHz dual-core SPARC V9 microprocessor. In *Digest of Technical Papers, International Solid-State Circuits Conference*, pp. 186-187, 2005.

Jason Stinson and Stefan Rusu. A 1.5GHz third generation Itanium processor. In *Digest of Technical Papers, InternationalSolid-State Circuits Conference*, pp. 252-253, 2003.

Joachim Clabes et al. Design and implementation of the POWERS microprocessor. In *Digest of Technical Papers,International Solid-State Circuits Conference*, pp. 56-57, 2004.

John A. McNeill. Jitter in ring oscillators. *IEEE Journal of Solid-State Circuits*, 32(6):870-879, Jun. 1997.

John Wood, Terence C. Edwards, and Steve Lipa. Rotary traveling-wave oscillator arrays: a new clock technology. *IEEE Journal of Solid-State Circuits*, 36(11):1654-1665, Nov. 2001.

L. Hall, M. Clements, W. Liu, and G. Bilbro. Clock distribution using cooperative ring oscillators. In *Proceedings of the Seventeenth Conference on Advanced Research in VLSI*, pp. 62-75, 1997.

Martin Saint-Laurent and Madhavan Swaminathan. A multi-PLL clock distribution architecture for gigascale integration. In *Proceedings of the International Conference on Computer Design*, pp. 214-220, 2001.

Mina Danesh and John R. Long. Differentially driven symmetric microstrip inductors. *IEEE Journal of Solid-State Circuits*, 50(I):332-341, Jan. 2002.

Patrick Mahoney, Eric Fetzer, Bruce Doyle, and Sam Naffziger. Clock distribution on a dual-core, multi-threaded Itanium-family processor. In *Digest of Technical Papers, International Solid-State Circuits Conference*, pp. 292-293, 2005.

Phillip J. Restle et al. A clock distribution network for microprocessors. *IEEE Journal of Solid-State Circuits*, 36(5):792-799, May 2001.

Simon Tarn, Rahul Dilip Limaye, and Utpal Nagarji Desai. Clock generation and distribution for the 130-nm Itanium 2 processor with 6-MB on-die L3 cache. *IEEE Journal of Solid-State Circuits*, 39(4):636-642, Apr. 2004.

Simon Tarn, Stefan Rusu, Utpal Nagarji Desai, Robert Kim, Ji Zhang, and Ian Young. Clock generation and distribution for the first IA-64 microprocessor. *IEEE Journal of Solid-State Circuits*, 35(11):1545-1552, Nov. 2000.

Steven C. Chan, Kenneth L. Shepard, and Phillip J. Restle. Uniform-phase, uniform-amplitude, resonant-load global clock distributions. *IEEE Journal of Solid-State Circuits*, 40(I):102-109, Jan. 2005.

Thucydides Xanthopoulos, Daniel W. Bailey, Atul K. Gangwar, Michael K. Gowan, Anil K. Jain, and Brian K. Prewitt. The design and analysis of the clock distribution network for a 1.2GHz Alpha microprocessor. In *Digest of Technical Papers, International Solid-State Circuits Conference*, pp. 402-403, 2001.

V. L. Chi. Salphasic distribution of clock signals for synchronous systems. *IEEE Transactions on Computers*, 43(11):597-602, May 1994.

Vadim Gutnik and Anantha Chandrakasan. Active GHz clock network using distributed PLLs. *IEEE Journal of Solid-State Circuits*, 35(11):1553-1560, Nov. 2000.

W. Athas, N. Tzartzanis, L. J. Svensson, L. Peterson, H. Li, X. Jiang, P. Wang, and W.-C. Liu. AC-1: A clock-power microprocessor. In *Proceedings of the International Symposium on Low-Power Electronics and Design*, pp. 328-333, 1997.

W. C. Athas, L. J. Svensson, and N. Tzartanis. A resonant signal driver for two-phase, almost-non-overlapping clocks. In *International Symposium on Circuits and Systems*, pp. 129-132, 1996.

W. C. Athas, L. J. Svensson, J. G. Roller, N. Tzartzanis, and Y. Chou. Low-power digital systems based on adiabatic-switching principles. *IEEE Trasactions on VLSI Systems*, 2(4):398-407, Dec. 1994.

Steven C. Chan et al., Design of Resonant Global Clock Distributions, Proceedings of the 21st International Conference on Computer Design (ICCD '03) 2003.

International Search Report and Written Opinion issued for corresponding International Patent Application No. PCT/US2006/049574, Dec. 29, 2006.

* cited by examiner

SYSTEMS AND METHODS FOR DISTRIBUTING A CLOCK SIGNAL

CROSS-REFERENCE TO RELATED APPLICATIONS

This application is a U.S. National Phase Application Under 35 U.S.C. §371 of International Patent Application No. PCT/US2006/049574, filed Dec. 29, 2006, which claims the benefit of U.S. Provisional Patent Application No. 60/754,728, filed on Dec. 29, 2005, entitled "Distributed Differential Oscillator Global Clock Distribution," each of which is hereby incorporated by reference herein in its entirety.

STATEMENT REGARDING FEDERALLY SPONSORED RESEARCH OR DEVELOPMENT

This research is sponsored in part by NSF grant CCR-00-86007. The government may have certain rights in the disclosed subject matter.

TECHNOLOGICAL FIELD

The disclosed subject matter relates to systems and methods for distributing a clock signal.

BACKGROUND

One way of distributing a global clock on a chip is using a hierarchical approach, in which a tuned and balanced tree drives a grid that provides a local clock signal to the components of the chip. Ensuring that this tree-driven grid global clock network is low-skew and low-jitter in the presence of process, voltage, and temperature (PVT) variation is a significant challenge. As clock frequencies increase with the scaling of technology, the problem becomes even more difficult.

One approach is to use standing-wave clock distributions. These have been used at both the board level and the chip level. These designs can reduce clock skew and jitter, and can save power due to the resonance between the clock capacitance and the clock wire inductance. However, standing-wave clock distributions must contend with non-uniform clock amplitude, which may result in skew or make local clock buffering more complex. Traveling-wave clock distributions use coupled transmission line rings to reduce clock skew and jitter, and also benefit from the power advantage of resonance. However, traveling-wave clock distributions have non-uniform phase across the distribution. This makes integration with existing local clocking methodologies difficult.

Another approach is to distribute clock generation by using oscillator array clocks. Distributed clock generation reduces the distance between a clock source and a clock load. However, this approach requires the need for synchronization. This can be done using phase detectors, or by directly coupling the oscillators together using interconnects. Oscillator array clocks are complicated by non-uniform phase, non-uniform amplitude, and/or complex synchronization schemes.

SUMMARY

Systems and methods for distributing a clock signal are disclosed.

In some embodiments, systems for distributing a clock signal include a plurality of resonant oscillators, each comprising an inductor; and a differential clock grid that distributes the clock signal. The differential clock grid is coupled to the plurality of resonant oscillators and the clock signal, and the inductances of the inductors are configured such that a resonant frequency of the plurality of resonant oscillators is substantially equal to the frequency of the clock signal.

In some embodiments, methods for distributing a clock signal include driving a differential clock grid with the clock signal, and coupling a plurality of resonant oscillators to the differential clock grid. Each resonant oscillator comprises an inductor with an inductance such that a resonant frequency of the plurality of resonant oscillators is substantially equal to the frequency of the clock signal, and the differential clock grid distributes the clock signal.

In some embodiments, systems for distributing a clock signal include a means for storing and discharging at least part of the energy of the clock signal at a frequency substantially equal to the frequency of the clock signal, and a means for differentially distributing the clock signal connected to the means for storing and discharging at least part of the energy of a clock signal.

DETAILED DESCRIPTION

In accordance with various embodiments of the disclosed subject matter, systems and methods for distributing a clock signal are provided. The clock signal can be used to differentially drive a global clock grid and a set of resonant oscillator tiles that are tuned to resonate at the desired clock frequency. The oscillator tiles can include an inductor that stores the energy of the clock signal between clock cycles. To maintain resonance, a gain element can be connected to the inductor. The replicated clock signal from each of the tiles can be used to drive H-treelets, which can drive a global differential clock grid. The global clock grid can drive local clocking systems. In some embodiments, the clock signal can be provided by an external clock source, to which the system can be injection locked. The system can also use an injection locking tree in some embodiments. A de-skewing circuit can be used to maintain the same clock phase at different parts of the chip. Automatic amplitude control can also be used to ensure that the needed amount of energy is used to maintain resonance of the resonant oscillators.

Figure 1:
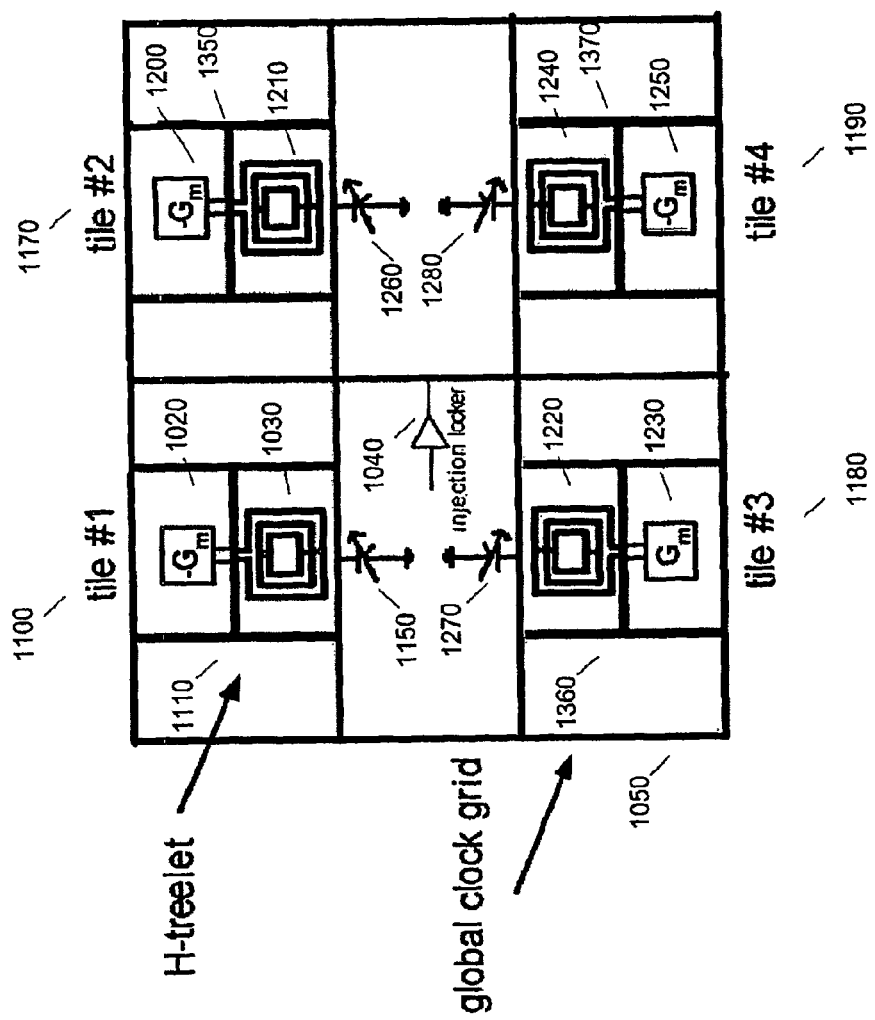
FIG. 1 is a schematic diagram of a clock distribution system in accordance with some embodiments of the disclosed subject matter.

FIG. 1 shows a schematic diagram of a clock distribution system in accordance with some embodiments of the disclosed subject matter. In this embodiment, four resonant tiles 1100, 1170, 1180, and 1190 are shown, although any suitable number can be used. An injection locker 1040 locks onto and buffers an external clock signal, which is used to entrain the global clock grid 1050 to a desired external frequency and phase. Resonant tiles 1100, 1170, 1180, and 1190 resonate at the clock signal's frequency and provide additional energy to the global clock grid. Injection locker 1040 can have differential outputs to connect to global clock grid 1050 and H-treelets 1110, 1350, 1360, and 1370.

Tile 1100 has a spiral inductor 1030, a gain element 1020, and an array of switchable capacitors symbolically shown as a tunable capacitor 1150. The other tiles can be similarly designed: tile 1170 has gain element 1200, spiral inductor 1210 and tunable capacitor 1260; tile 1180 has gain element 1230, spiral inductor 1220 and tunable capacitor 1270; and tile 1190 has gain element 1250, spiral inductor 1240 and tunable capacitor 1280.

The H-treelets 1110, 1350, 1360, and 1370 route a clock signal from the resonant tiles (e.g., 1100, 1170, 1180, and 1190) to the global clock grid. The global clock grid 1050 is a set of conductors (e.g., wires) that distribute a clock signal to the local components of a chip. Because the global clock grid can use differential signaling, the lines can be made up of a pair of wires, and signaling is performed by transmitting a separate voltage on each wire. The receiver detects the difference between the voltages to determine the signal that was sent. The components on the chip connected to the global clock grid can use local clocking techniques within the component. This hierarchal clock distribution can reduce clock skew and jitter.

Spiral inductors 1030, 1210, 1220, or 1240 can be a layer of metal trace routed in the shape of a spiral. For example, one design is a three-turn spiral having a diameter of 90 um, using 6 um wide Cu trace. The turns can be spaced 13 um apart. Vias connecting the spiral inductor to other metal layers can be used and small cuts can be made in the power grid along the vertical and horizontal axis to reduce eddy currents in the power-ground network beneath the spiral inductor. The two ends of the spiral indictor can be connected across the differential pair of the H-treelets 1110, 1350, 1360, and 1370.

The tunable capacitors 1150, 1260, 1270, and 1280 can be used to tune the resonant frequency of the spiral inductor. This resonant frequency can be, for example, 2 GHz. The capacitors can also be used to adjust for process variations. A tunable capacitor can be formed from an array of capacitors and tuned by switching on one or more capacitors in the array of capacitors. In accordance with some embodiments of the disclosed subject matter, the capacitors can be fabricated using transistors. The tunable capacitors can be connected anywhere on the differential clock grid.

The gain elements 1020, 1200, 1230, and 1250, which can be negative differential transconductors, can be used to compensate for losses in the spiral inductors and help maintain resonance of the clocking network. Similarly to the inductors, and as described below in connection with FIG. 1A, the two outputs of the gain elements can be connected across the differential pair of the H-treelets 1110, 1350, 1360, 1370.

As shown in FIG. 1, the injection locker 1040 is located centrally in some embodiments. The clock signal can be at a lower frequency and be multiplied before being distributed to the plurality of resonant oscillator tiles.

Figure 1A:
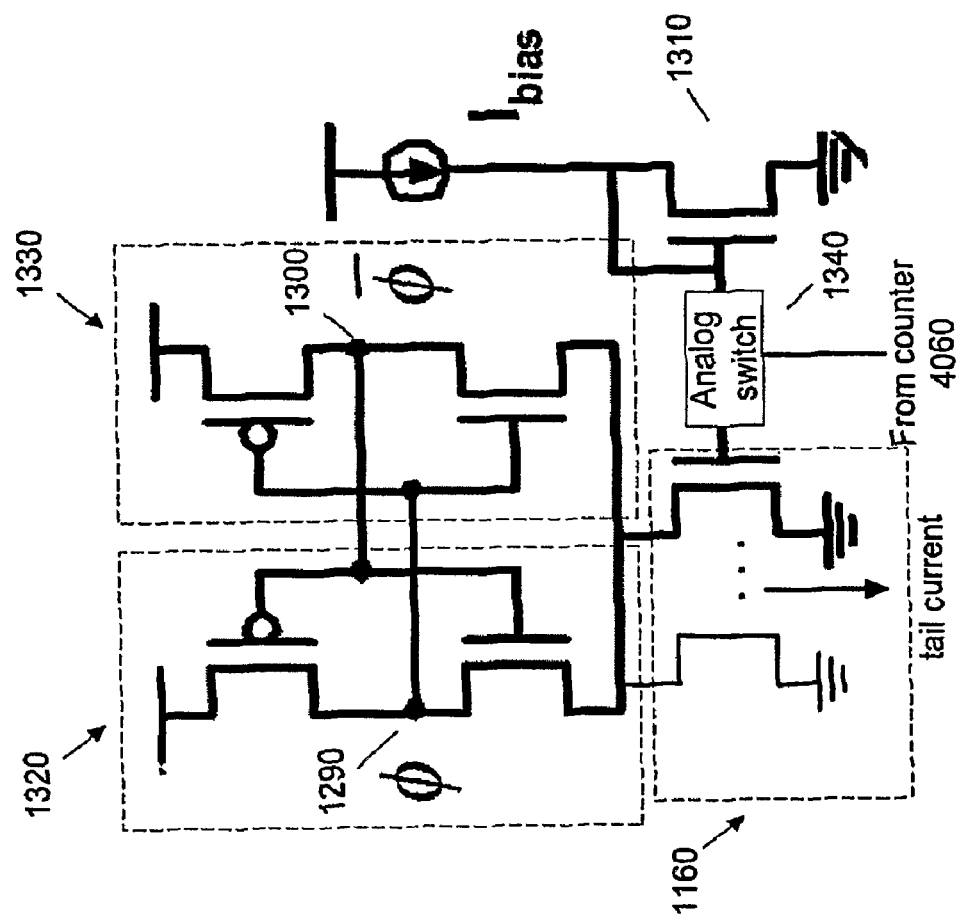
FIG. 1A is a schematic diagram of a gain element in accordance with some embodiments of the disclosed subject matter.

FIG. 1A is a schematic diagram of a gain element in accordance with some embodiments of the disclosed subject matter. The gain element connects to the clock signals of the H-treelets 1110, 1350, 1360, 1370 at clock signals $\phi$ 1290 and $\bar{\phi}$ 1300. Using feedback, the gain element provides additional energy to the H-treelets and global clock grid to maintain oscillation. Transistor array 1160 and transistor 1310 form a current mirror that controls the tail current, and therefore the gain of the gain element (e.g., 1020). Gain is provided to clock signals $\phi$ 1290 and $\bar{\phi}$ 1300 by inverters 1320 and 1330. The output of inverter 1330 is connected to the input of inverter 1320 and vice versa. Therefore, when clock signal $\phi$ 1290 to inverter 1330 is low, inverter 1330 provides energy to clock signal $\bar{\phi}$ 1300 which is connected to the output of inverter 1320.

Figure 4:
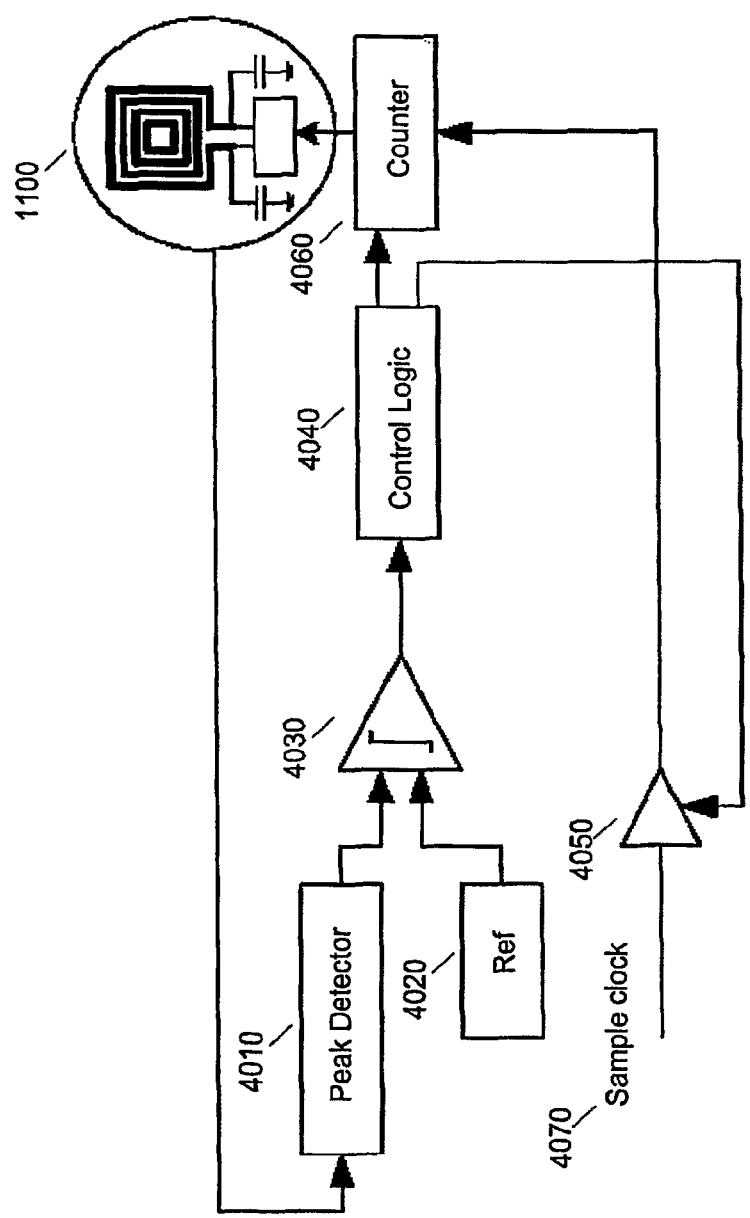
FIG. 4 shows a block diagram of an automatic amplitude control circuit in accordance with some embodiments of the disclosed subject matter.

Analog switches 1340 (one for each tail current device) can be connected to the gates of the transistors forming transistor array 1160. Analog switches 1340 can be controlled by the thermometer-decoded output of a counter 4060 (FIG. 4). The value of the counter can be used by analog switches 1340 to turn on or off in one or more transistors from array 1160. The number of transistors turned on affects the tail current flowing through the transistors, and therefore the gain provided by the gain element.

Thus, in some embodiments, in operation, an external clock signal is buffered using injection locker 1040. The clock signal is used to entrain the global clock grid. The resonant tiles of the system resonate at a frequency near the desired clock frequency and also drive the global clock grid. The energy of the clock signal is stored within the inductors (more precisely, within the magnetic fields of the inductors) during one phase of the clock signal. During the next phase of the clock signal, the energy in the inductors is then transferred back into the clock network.

Figure 5:
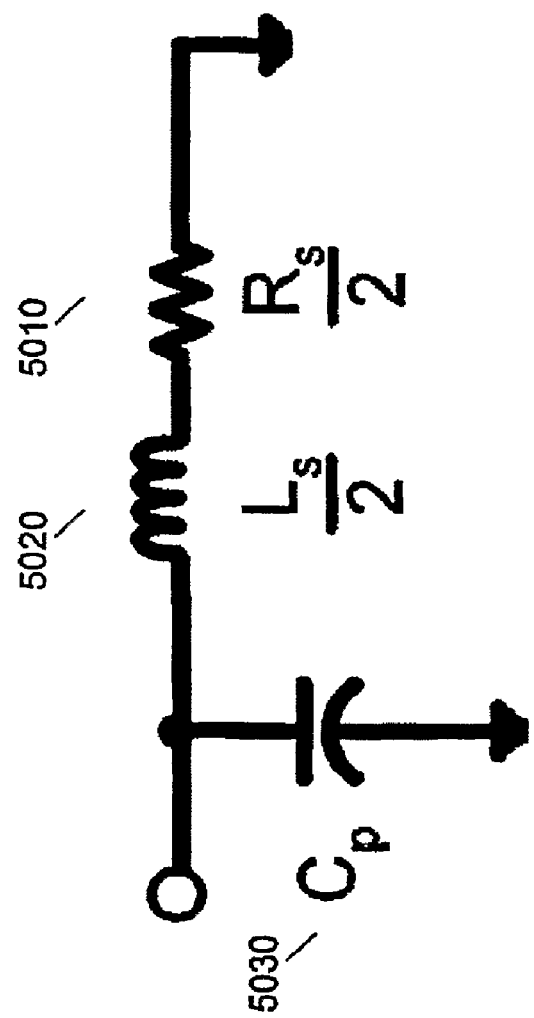
FIG. 5 shows a model of the inductor in accordance with some embodiments of the disclosed subject matter.

The inductance of the inductor and the clock network's resistance and capacitance form a resonant network, such that the energy is stored and discharged from the inductors at a resonant frequency dependent on the three factors of inductance, resistance, and capacitance. This relationship is illustrated further below in connection with FIG. 5.

Figure 2:
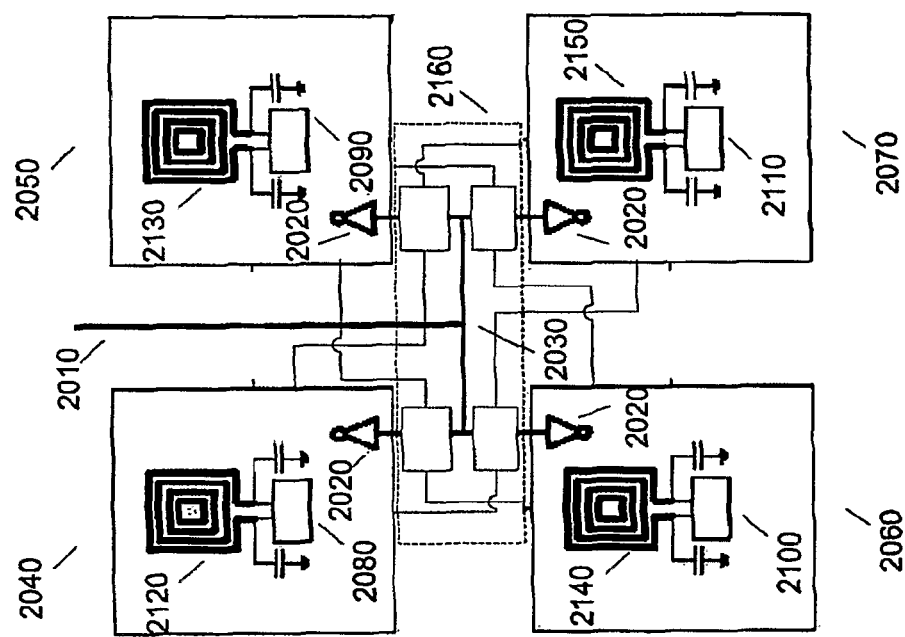
FIG. 2 shows a schematic diagram of a clock distribution system injection locking trees in accordance with some embodiments of the disclosed subject matter.

FIG. 2 shows details of a distributed differential oscillator clock system in accordance with some embodiments of the disclosed subject matter. The system is divided into tiles 2040, 2050, 2060, and 2070, with each tile having, respectively, a corresponding inductor 2120, 2130, 2140, and 2150. Each tile 2040, 2050, 2060, and 2070 can also have a corresponding gain element 2080, 2090, 2100, and 2110, respectively, as described with respect to FIG. 1. However, instead of having an injection locker 1040 that is centrally located, this system has a differential injection locking tree 2010 with a buffer 2020 differentially connected to the tree located at each tile. In some embodiments, the external clock can be locked onto and buffered at the center 2030 of the tree, and then distributed and buffered at each of the resonant tiles. In some embodiments, each resonant tile can have a de-skewing circuit (shown grouped as 2160) located between the injection locked clock signal and the respective resonant tiles. Further details of individual de-skewing circuits are described with respect to FIG. 3.

Figure 3:
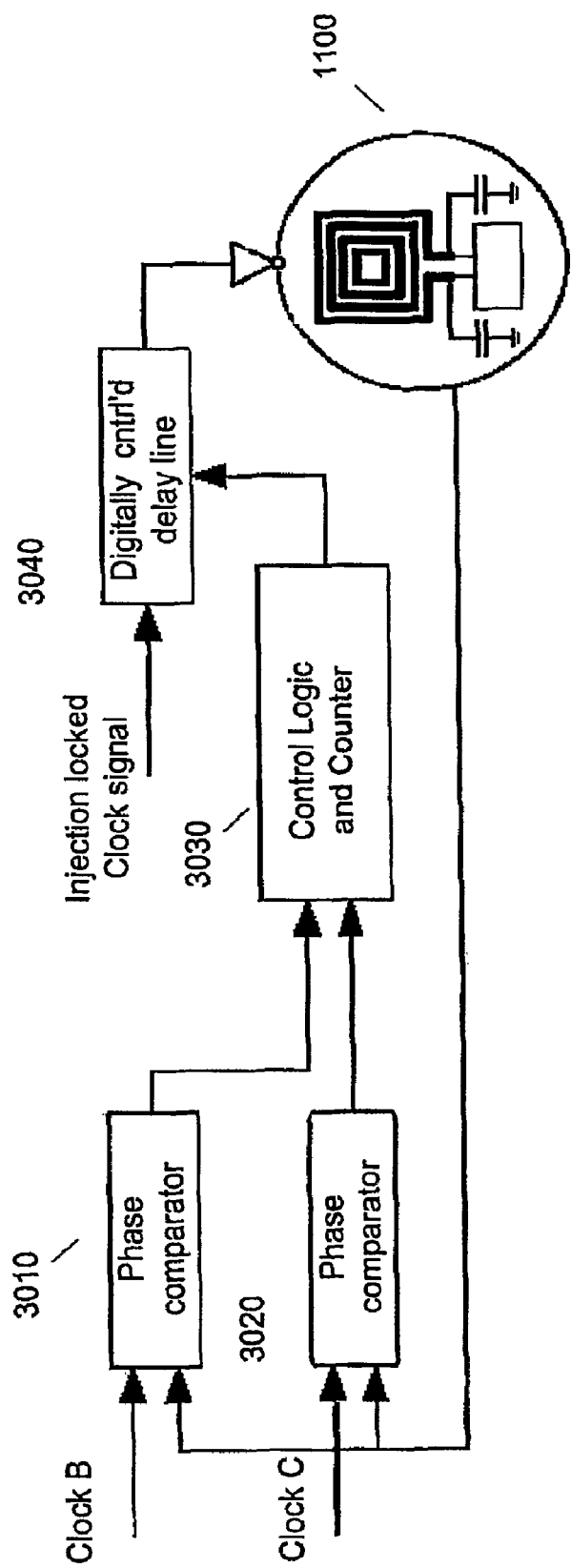
FIG. 3 shows a block diagram of a de-skewing circuit in accordance with some embodiments of the disclosed subject matter.

FIG. 3 shows details of a de-skewing circuit in accordance with some embodiments of the disclosed subject matter that can be used to maintain the same clock phase between the resonant oscillator tiles.

The de-skewing circuit in FIG. 3 is a digital delay lock loop. The circuit has two phase comparators 3010 and 3020, the outputs of which are inputs to control logic and counter 3030. Control logic and counter 3030 is used to adjust the delay line in series with the clock signal to align its phase between the resonant oscillator tiles (e.g., 1100).

Phase comparator 3010 compares the phase of the clock signal of tile 1100 with the clock signal from neighboring resonant tile B (e.g., 1170). Similarly, phase comparator 3020 compares the phase of the clock signal of tile 1100 with the phase of a clock signal from a neighbor C (e.g., 1180). If the phase of local tile 1100 clock signal is found to be between that of neighbor B and neighbor C, no change is made to the phase of the local clock signal by control logic 3030. If the phase is found to be ahead of both neighbors, the clock signal is slowed down. Similarly, if the phase is found to be behind both neighbors, the clock signal is sped up.

Figure 3A:
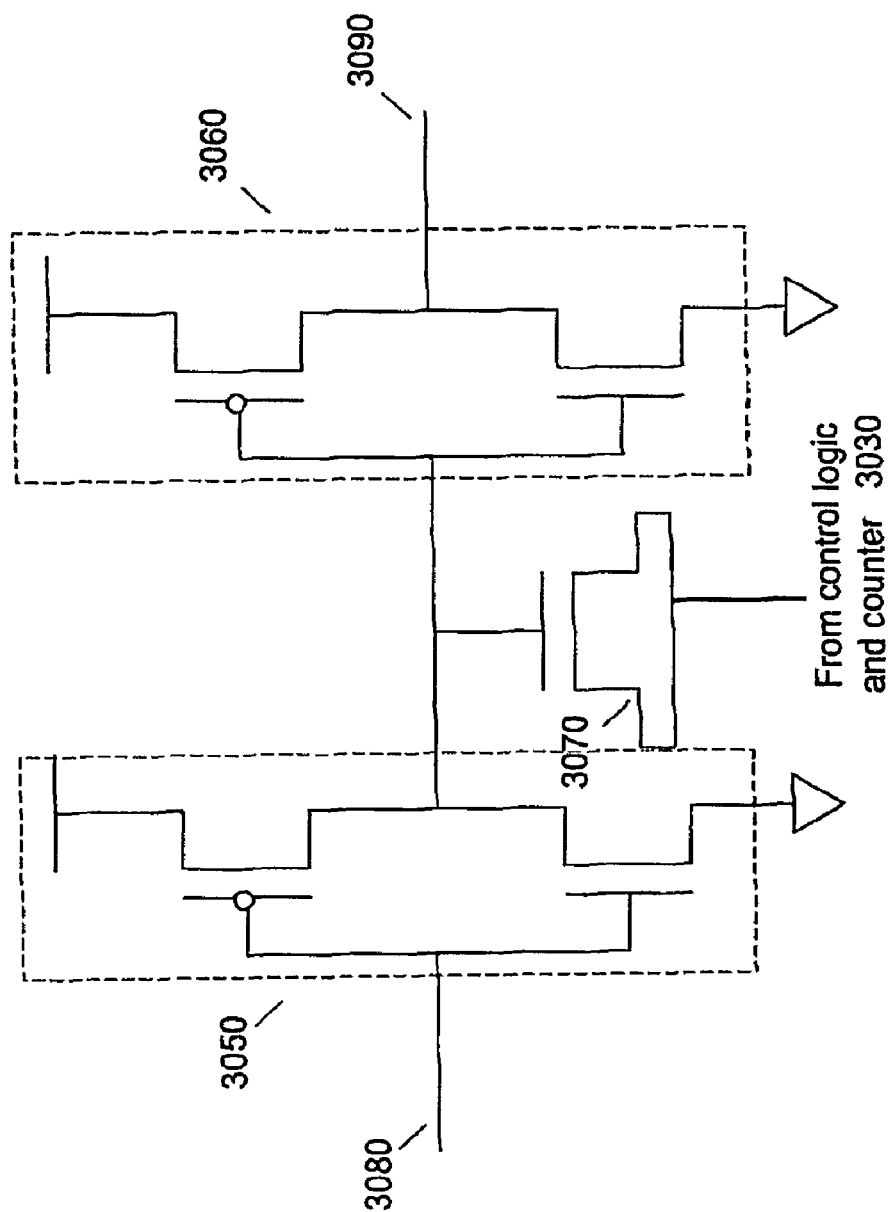
FIG. 3A is a schematic diagram of a digitally controlled delay line in accordance with some embodiments of the disclosed subject matter.

FIG. 3A is a schematic diagram of a digitally controlled delay line 3040 in accordance with some embodiments of the disclosed subject matter. The delay line can be made of an array of inverters. In FIG. 3A, two inverters 3050 and 3060 are shown, however any suitable number can be used. An input clock signal is applied to the first inverter in the array (in this embodiment inverter 3050), and the output clock signal can be read from the last inverter in the array (in this embodiment inverter 3060). In between each of the inverters can be a capacitance 3070 that is controlled by control logic and counter 3030 (FIG. 3). In an array of inverters with more than two inverters, there would be multiple capacitances, one between each pair of inverters, such as inverters 3050 and 3060. The value of the counter can determine whether capacitance 3070 or another a capacitance (not shown) is selected to be applied. The value of counter can also be used to select multiple capacitances to be applied depending on the size of the array of inverters. This changing capacitance changes the delay of the delay line.

FIG. 4 shows details of an automatic amplitude control circuit in accordance with some embodiments of the disclosed subject matter. The automatic amplitude control is able to ensure that the power that is needed to sustain oscillation is supplied to the resonator. The circuit has a peak detector 4010, a reference input 4020, a clocked comparator 4030, counter 4060, and control logic 4040. The comparator 4030 compares a reference voltage 4020 with the voltage level of the clock signal from peak detector 4010. The signal level in the peak detector 4010 comes from a resonant tile (e.g., 1100), and may be differentially connected on the clock grid. The voltage level of the clock signal is converted to a DC level before the comparison.

The comparison is provided as an input to control logic 4040, which controls a clock buffer 4050 by turning it on or off as needed. The output of clock buffer 4050, in combination with control signals from control logic 4040, in turn increases or decreases the count in counter 4060. Sample clock 4070 provides the clock signal to clock buffer 4050 that is used to increase or decrease the count in counter 4060. The sample clock 4070 can come from off chip, or be generated on chip, for example, by using a ring oscillator.

Counter 4060 is connected to analog switch 1340 (FIG. 1A) used to select one or more transistors from the array of transistors 1160 (FIG. 1A), which controls the tail current, and therefore the gain provided by the gain element as described above, for example.

One implementation of a distributed differential oscillator global clock distribution system will now be described in connection with FIG. 1. The system can be fabricated in a 0.18 um CMOS process with six layers of aluminum interconnect in a chip. Each of the aluminum layers can be used to route signals. Lower layers having narrower wires can be used to route signals more locally within a chip, and higher layers with wider wires can be used to route global signals such as clock and power. The spiral inductors can be made 280 um in diameter, and be formed from the top two aluminum metal layers. The metal layers can be connected by vias, which can serve to reduce the series resistance.

The global clock wires, the tiles, and the local clock buffers present a capacitive load to the clock signal. Additional capacitive load can be added to each clock phase through the tunable capacitor 1150, 1260, 1270, and 1280. In some embodiments, these tunable capacitors ($C_{tune}$) can provide up to 5 pF (1.25 pF per tile) and can provide tuning of the oscillation frequency from 1.6 to 2.1 GHz. The differential global clock wires can be made 6 um wide and be spaced 8 um apart. The spacing of the wires maintains a controlled global clock grid inductance, since the wires provides current return paths for each other. The inductance of such a global clock grid can be about 0.4 nH/mm in a system with four tiles and designed as described above.

Bias current, $I_{bias}$, suitable to initiate oscillation of a global clock network in accordance with the above design can be 0.06 mA for $C_{tune}$=0 and 0.13 mA for $C_{tune}$=5 pF. This corresponds to a transconductance of 5.0 and 8.9 mS per gain element for $C_{tune}$=0 and 5 pF. At these biases, the clock amplitude can be 140 mV.

At resonance, using a half-circuit three-element lumped model with $R_s/2$ 5010, $L_s/2$ 5020, and $C_p$ 5030 (shown in FIG. 5), the magnitude of the differential driving point admittance per tile (as seen by a single gain element) can be 5.0 mS at 1.6 GHz for $C_{tune}$=0 and 9.8 mS at 1.1 GHz for $C_{tune}$=5 pF. The resistance $R_s/2$ 5010 can model the resistive losses in the clock network, $L_s/2$ 5020 can model the spiral inductance, and $C_p$ 5030 can model the capacitance of the clock network. At around 0.9 mA of $I_{bias}$, the clock can approximately reach it's maximum voltage level for $C_{tune}$=0, while for $C_{tune}$=5 pF, the clock can reach its maximum voltage level at a slightly lower bias current of about 1.0 mA.

Various embodiments of the invention are apparent from the detailed specification, and thus, it is intended by the appended claims to cover all such features and of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents can be resorted to falling within the scope of the invention. Additionally, disclosed features from different embodiments can be combined with one another.

What is claimed is:

1. A system for distributing a clock signal comprising:
    a plurality of resonant oscillators, each comprising an inductor; and
    a differential clock grid, coupled to the plurality of resonant oscillators and the clock signal, that distributes the clock signal,
    wherein the inductances of the inductors are configured such that a resonant frequency of the plurality of resonant oscillators is substantially equal to the frequency of the clock signal.

2. The system of claim 1, further comprising an injection locker that provides the clock signal from an external source to the differential clock grid.

3. The system of claim 2, wherein the injection locker is an injection locking tree providing a clock signal to the plurality of resonant oscillators.

4. The system of claim 1, further comprising a plurality of H-treelets coupling the differential clock grid to the plurality of resonant oscillators.

5. The system of claim 1, wherein each of the plurality of resonant oscillators further comprises a gain element to maintain oscillation.

6. The system of claim 1, wherein each of the plurality of resonant oscillators further includes a tunable capacitor for tuning the resonant oscillator.

7. The system of claim 6, wherein the tunable capacitor is digitally tunable.

8. The system of claim 1, wherein the inductors are spiral inductors.

9. The system of claim 1, further comprising a de-skewing circuit for aligning the phase of the clock signal between each of the plurality of resonant oscillators.

10. The system of claim 1, further comprising a gain element coupled to each of the plurality of resonant oscillators to provide gain to the clock signal.

11. The system of claim 10, further comprising an automatic amplitude control circuit for adjusting the gain of the gain element.

12. A method for distributing a clock signal comprising:
    driving a differential clock grid with the clock signal; and
    coupling a plurality of resonant oscillators to the differential clock grid, wherein each resonant oscillator comprises an inductor with an inductance such that a resonant frequency of the plurality of resonant oscillators is substantially equal to the frequency of the clock signal,
    wherein the differential clock grid distributes the clock signal.

13. The method of claim 12, further comprising adjusting the resonant frequency of the plurality of resonant oscillators.

14. The method of claim 12, further comprising aligning the phase of the clock signal between each of the plurality of resonant oscillators.

15. The method of claim 12, further comprising compensating for loss using a gain element.

16. The method of claim 15, further comprising automatically adjusting the gain of the gain element.

17. The method of claim 12, further comprising injection locking the clock signal from an external source.

18. The method of claim 17, further comprising using an injection locking tree to provide the clock signal to the plurality of resonant oscillators.

19. A system for distributing a clock signal comprising:
    a means for storing and discharging at least part of the energy of the clock signal at a frequency substantially equal to the frequency of the clock signal; and
    a means for differentially distributing the clock signal connected to the means for storing and discharging at least part of the energy of a clock signal.

20. The system of claim 19, further comprising means for maintaining oscillation connected to the means for storing and discharging the energy of a clock signal.

21. The system of claim 20, further comprising means for adjusting a gain of the means for maintaining oscillation.

22. The system of claim 21, further comprising means for aligning the phase of the clock signal between each of the means for storing and discharging at least part of the energy of the clock signal.

* * * * *